United States Patent
Staicu et al.

(10) Patent No.: US 9,304,406 B2
(45) Date of Patent: Apr. 5, 2016

(54) FIELD FACET MIRROR FOR AN ILLUMINATION OPTICS OF A PROJECTION EXPOSURE APPARATUS FOR EUV MICROLITHOGRAPHY

(71) Applicant: Carl Zeiss SMT GmbH, Oberochen (DE)

(72) Inventors: Adrian Staicu, Ulm (DE); Martin Endres, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 146 days.

(21) Appl. No.: 14/251,100

(22) Filed: Apr. 11, 2014

(65) Prior Publication Data

US 2014/0218709 A1    Aug. 7, 2014

Related U.S. Application Data

(60) Division of application No. 13/034,275, filed on Feb. 24, 2011, now Pat. No. 8,717,541, which is a continuation of application No. PCT/EP2009/006290, filed on Aug. 31, 2009.

(60) Provisional application No. 61/101,445, filed on Sep. 30, 2008.

(30) Foreign Application Priority Data

Sep. 30, 2008   (DE) .......................... 10 2008 049 586

(51) Int. Cl.
*G03B 27/54*  (2006.01)
*G03F 7/20*   (2006.01)
(Continued)

(52) U.S. Cl.
CPC .............. *G03F 7/702* (2013.01); *G02B 5/0891* (2013.01); *G02B 5/09* (2013.01); *G02B 19/0023* (2013.01);
(Continued)

(58) Field of Classification Search
CPC ............ G02B 19/023; G02B 19/0047; G02B 19/0095; G02B 5/0875; G02B 5/0891; G02B 5/09; G03F 7/70075; G03F 7/70083; G03F 7/70108; G03F 7/702
USPC ........................................................ 355/67
See application file for complete search history.

(56) References Cited

U.S. PATENT DOCUMENTS

| 8,717,541 B2 | 5/2014 | Staicu et al. |
| 2005/0008870 A1 | 1/2005 | McGuire et al. |

(Continued)

FOREIGN PATENT DOCUMENTS

| DE | 10 2006 031 654 | 10/2007 |
| DE | 10 2007 008 448 | 8/2008 |

(Continued)

OTHER PUBLICATIONS

Japanese office action with English translation thereof for JP Appln. No. 2014-137934, 6 pages, dated Jun. 25, 2015.

(Continued)

*Primary Examiner* — Peter B Kim
(74) *Attorney, Agent, or Firm* — Fish & Richardson P.C.

(57) ABSTRACT

A field facet mirror for an illumination optics of a projection exposure apparatus for EUV microlithography transmits a structure of an object arranged in an object field into an image field. The field facet mirror has a plurality of field facets with reflection surfaces. The arrangement of the field facets next to one another spans a base plane. Projections of the reflection surfaces of at least two of the field facets onto the base plane differ with respect to at least one of the following parameters: size, shape, orientation. A field facet mirror results which can ensure a uniform object field illumination with a simultaneously high EUV throughput.

20 Claims, 15 Drawing Sheets

(51) Int. Cl.
  *G02B 5/09* (2006.01)
  *G02B 19/00* (2006.01)
  *G02B 5/08* (2006.01)

(52) U.S. Cl.
  CPC ........ *G02B 19/0047* (2013.01); *G02B 19/0095* (2013.01); *G03F 7/70075* (2013.01); *G03F 7/70083* (2013.01); *G03F 7/70108* (2013.01); *G02B 5/0875* (2013.01); *Y10T 29/49826* (2015.01)

(56) References Cited

U.S. PATENT DOCUMENTS

| | | |
|---|---|---|
| 2005/0030656 A1 | 2/2005 | Holderer et al. |
| 2005/0174650 A1 | 8/2005 | Melzer et al. |
| 2006/0103908 A1 | 5/2006 | Loopstra et al. |
| 2006/0132747 A1 | 6/2006 | Singer et al. |
| 2007/0146853 A1 | 6/2007 | Singer et al. |
| 2008/0123807 A1 | 5/2008 | Warm et al. |
| 2008/0165925 A1 | 7/2008 | Singer et al. |
| 2008/0266686 A1 | 10/2008 | Dengel |
| 2010/0007866 A1 | 1/2010 | Warm et al. |
| 2011/0164233 A1 | 7/2011 | Staicu et al. |
| 2013/0100426 A1 | 4/2013 | Warm et al. |

FOREIGN PATENT DOCUMENTS

| | | |
|---|---|---|
| DE | 10 2008 009 600 | 8/2009 |
| EP | 0 952 491 A1 | 10/1999 |
| EP | 1 024 408 A | 8/2000 |
| EP | 1 811 547 | 7/2007 |
| JP | 2000-162415 | 6/2000 |
| JP | 2000-221406 | 8/2000 |
| JP | 2005-524236 | 8/2005 |
| JP | 2006-140504 | 6/2006 |
| JP | 2006-253486 | 9/2006 |
| JP | 2006-523944 | 10/2006 |
| JP | 2007-150295 | 6/2007 |
| JP | 2008-135743 | 6/2008 |
| JP | 2010-519725 | 6/2010 |
| WO | WO 2004/092844 | 10/2004 |
| WO | WO 2007/128407 | 11/2007 |
| WO | WO 2008/101656 | 8/2008 |
| WO | WO 2008/149178 | 12/2008 |

OTHER PUBLICATIONS

International Search Report for the corresponding PCT Application No. PCT/EP2009/006290, mailed Feb. 25, 2010.

English translation of German Examination Report for corresponding German Patent Application 10 2008 049 586.7-51, dated Feb. 23, 2009.

Japanese Office Action, with English translation thereof, for corresponding JP Appl No. 2011-528206, dated Mar. 27, 2013.

Taiwanese office action, with English translation thereof, for TW Appl No. 98 130 332, dated Oct. 3, 2014.

Korean office action, with English translation thereof, for corresponding KR Appl No. 10-2011-7007342, dated Nov. 17, 2015.

Japanese Final Rejection, with translation thereof, for JP Appl No. 2014-137 934, dated Jan. 21, 2016.

FIELD FACET MIRROR FOR AN ILLUMINATION OPTICS OF A PROJECTION EXPOSURE APPARATUS FOR EUV MICROLITHOGRAPHY

CROSS-REFERENCE TO RELATED APPLICATIONS

This application is a divisional of, and claims benefit under 35 USC 120 to, U.S. application Ser. No. 13/034,275, filed Feb. 24, 2011, which is a continuation of, and claims benefit under 35 USC 120 to, international application PCT/EP2009/006290, filed Aug. 31, 2009, which claims benefit under 35 USC 119 of German Application No. 10 2008 049 586.7, filed Sep. 30, 2008 and under 35 USC 119(e) of U.S. Ser. No. 61/101,445, filed Sep. 30, 2008. U.S. application Ser. No. 13/034,275 and international application PCT/EP2009/006290 are hereby incorporated by reference in their entirety.

FIELD

The disclosure relates to a field facet mirror for an illumination optics of a projection exposure apparatus for EUV microlithography. The disclosure also relates to a method for producing a field facet mirror of this type, an illumination optics with a field facet mirror of this type, an illumination system with an illumination optics of this type, a projection exposure apparatus with an illumination system of this type, a method for producing a microstructured or nanostructured component using a projection exposure apparatus of this type, and a component which is microstructured or nanostructured and produced according to a production method of this type.

BACKGROUND

A field facet mirror for use in an illumination optics of a projection exposure apparatus for EUV microlithography is known from WO 2007/128407A.

Often, field facet mirrors of this type should, on the one hand, provide uniform illumination of the object field and, on the other hand, guide as large a faction as possible of the illumination light produced by an EUV light source to the object field. In this case, the facets of the field facet mirror receive a shape and an aspect ratio, which are adapted to the object field to be illuminated. There is still a desire for improvement in the known field facet mirrors in relation to the simultaneous ensuring of a uniform object field illumination, in particular when the illumination light provided by the EUV light source does not have a uniform intensity distribution over the illumination bundle, and a high EUV throughput.

SUMMARY

The disclosure provides a field facet mirror for use in an illumination optics of a projection exposure apparatus for EUV microlithography that can ensure a uniform object field illumination with a simultaneously high EUV throughput.

The disclosure discusses giving up the previously maintained boundary condition, according to which the projection of field facet edges in the direction of a normal of a support plate generally present of the known field facet mirrors is identical, and specifically identical both in relation to the size and also the shape and also in relation to the orientation. Owing to the new degree of freedom of permitting non-identically formed projections, a pre-compensation, for example, of a possible rotation of the images, because of the imaging conditions, of individual field facets relative to one another can be achieved during their superimposition on the object field. A rotation of this type of the facet images results, as is recognised according to the disclosure, because of various paths of the illumination light guided channel-wise via the field facets through the illumination optical system. A variation in the imaging scale of the field facets on the object field may also occur here. By giving up the condition of identical projections of the field facet reflection surfaces onto the base plane, this variation of the imaging scale may also be pre-compensated. During the imaging onto the object field, the rotation of the facet images without pre-compensation leads to the undesired effect of edge scattering of the object field illumination as the images of the field facets superimposed on the object field no longer match the different real facet faces, in particular at the edge. The base plane of the field facet mirror, which is spanned by the field facets arranged next to one another, is generally predetermined by a holding plane of a field facet support. This base plane generally coincides with a main reflection plane of the field facet mirror, relative to which the field facets can still be arranged tilted individually for the allocation of illumination channels of the illumination optical system. The main reflection plane is in this case the reflection plane with untilted field facets (field facets aligned with the holding plane).

The field facets may be arranged next to one another on a support plate. This support plate then generally runs parallel to the base plane of the field facet mirror.

At least two of the field facets may be arranged tilted with respect to one another by more than 1° about an axis perpendicular to the base plane of the field facet mirror. The tilting relative to an untilted starting position may, for example, be in the range between −3° and 3°, in the range between −2° and 2° or in the range between −1° and 1°. This tilting at most changes the tilting position of the reflection surfaces of the field facets slightly and thus has no or slight effects on the allocation of the tilted field facet to the illumination channels of the illumination optical system. Such a tilted arrangement of the field facets represents a degree of freedom which was previously rejected because of assumed steric accommodation problems of the field facets and which helps to reduce or even completely avoid an edge scattering of the object field illumination observed in the previously known occupation geometries of field facets on the field facet mirror. The degree of freedom according to the disclosure of the tilting of the field facets about an axis perpendicular to the base plane or to the main reflection plane facilitates a design in which tilting angles about axes, which lie in the main reflection plane and lead to too great a maladjustment between the face of the projection of the reflection surfaces of tilted field facets on the main reflection plane, on the one hand, and the real reflection face, on the other hand, are avoided. According to the disclosure, field facets with a more favourable aspect ratio in relation to their manufacturing can be used to occupy the field facet mirror, without a disruptive edge scattering in the object field illumination resulting. In addition, the degree of filling of the object field and therefore the transportable light conductance are thus effectively increased. This is important, in particular for sources with a large light conductance or for illumination systems, which offer illumination pupils which are filled to a different degree without light loss. An allocation of field facets tilted about the tilting axis perpendicular to the main reflection plane to the illumination angles predetermined by an allocation to pupil facets of a pupil facet mirror leads to the possibility of ensuring an intensity monitoring of the illumination light taking place at the edges of the object field with minimised losses. Field facets of this type may be used in a projection exposure system, within which, during a projection exposure, an object is displaced continuously or step-wise in an object displacement direction.

A part ring or arc shape of the field facets can allow well adapted illumination of a correspondingly part ring-shaped or arcuate object field. An object field shape of this type can be imaged well with a downstream projection optical system of the projection exposure apparatus designed as a mirror optical system.

An arrangement of the tilting axis can ensure that a tilting of the respective field facet only slightly changes the occupation requirement of this field facet in the main reflection plane, as a tilting at best leads to a slight deviation of the position of the arcuate or part ring-shaped side edges of the facet reflection face. During a tilting about this tilting axis, the end faces of the facet reflection surfaces leading or following in the peripheral direction about the partial circle or arc shape are practically exclusively displaced.

Field facets can be manufactured with a lower production outlay in comparison to field facets with a small part ring thickness. This minimal part ring thickness is accompanied by a thickness, which is accordingly easier to handle for the production of the field facets, of the respect field facet base body. In addition, the relative mutual shading of the field facets with increasing width may be less.

Field facets tilted about a further degree of tilting freedom can ensure a desired variability in the allocation of the field facets to pupil facets of a pupil facet mirror of an illumination optics of the EUV projection exposure system. A predetermined and well mixed allocation of pupil facets of the pupil facet mirror allocated to the field facets is possible. An axis is selected as the tilting axis for the further degree of tilting freedom, the tilting of which leads to as small a deviation as possible of a face of a field facet projected onto the main reflection plane from on the real reflection surface of the field facet.

Facet base bodies limited by opposing spherical side walls may be produced precisely. "Spherical" in this context means "shaped like the section of a face of a ball". Alternatively, the field facets may also have facet base bodies, which are limited by two cylindrical side walls which are opposing and displaced in parallel, in particular, with respect to one another. It is possible to arrange field facets of this type next to one another with small spacings, which leads to a high occupation density of the field facets within the main reflection plane.

A facet shape can be well matched to an arcuate or part ring shape of an object field to be illuminated. One of the two opposing spherical side walls is convex and the other of the two spherical side walls is concave.

Facets with side walls of the facet base body may, on the one hand, be closely packed and, on the other hand, allow a displacement of the two adjacent facet base bodies relative to one another along the spherical face of the two mutually facing side walls. This allows new degrees of freedom in the relative positioning of the field facets of the field facet mirror with respect to one another.

Field facets can be produced with one and the same processing tool for producing the spherical side walls.

Facet mirrors can be packed closely, on the one hand, and, on the other hand, can be arranged closely packed between other field facets and nevertheless be tilt-adjusted about the centre.

Field facets may also be adapted to more exotic object field forms or else to other requirements, for example to control the intensity of the illumination light.

A field facet mirror can allow the illumination of sensors arranged in the region of edges of the object field, so an effective monitoring of the energy or intensity of a light source, with which the facet mirror is loaded, is possible.

Field facets which are adjacent and tilted with respect to one another can have advantages which correspond to those of a field facet mirror.

Intermediate spaces can allow an individual arrangement of the individual field facets and thus good compensation of an undesired image tilting effect in the imaging of the field facets in the object field. The field facets may be arcuate or rectangular in design. The field facets may be arranged column-wise in the base plane of the field facet mirror. Packing densities of the field facets are possible, which are greater than 50%.

A field facet mirror, for which, according to the disclosure, various embodiments are given, can increase the EUV light throughput inside a projection exposure apparatus equipped with a field facet mirror of this type.

A manufacturing process can allow efficient production of field facet groups with side walls of adjacent facet base bodies, which have the same radius of curvature.

A manufacturing method can be adapted to facet block arrangements of field facet mirrors.

A manufacturing method can allow an exact orientation of the field facets assembled within a facet block.

The advantages of an illumination optics can correspond to those which have already been discussed above with reference to the field facet mirror according to the disclosure. It was recognised in the illumination optics, that the departure from the adjustment specification for the transmission facet mirrors, to in each case superimpose the centres of the field facet images in the object field, can lead to further degrees of freedom with regard to the optimisation of the total superimposition of the field facet images in the object field. The adjustment of the transmission facets takes place such that the superimposition of the facet images is optimised in total over the object field. The field facets and the associated transmission facets may be static facets or else actuatable facets, in other words facets which can be displaced in a controlled manner. The field facets and/or the transmission facets may be constructed from a plurality of individual facets. These individual facets may be displaceable, in a manner which is actuatable, relative to one another. A corresponding concept with an individual facet/individual mirror structure of this type is known from DE 10 2008 009 600 A. By displacing or tilting of the field facets, the transmission facet individually associated with a respective field facet may be selected from a plurality of possible transmission facets of the transmission facet mirror. The extended region in the centre of the object field, on which the centres of the reflection surfaces of the field facets are imaged in the illumination optics according to the disclosure, may take in an area in the order of magnitude of one or more $mm^2$. The extended region has an area, which is spanned by a dimension extending approximately tangentially to the images of the arcuate field facets and a dimension extending approximately radially to the images of the arcuate field facets. The tangential dimension may extend in the direction of a long field extent of the object field and the radial dimension may extend along a short field extent of the object field. The tangential dimension has a size, which is proportional to an arc radius of curvature of the images of the field facets and to the tangent (tan) of a tilting angle of the field facets relative to one another about an axis perpendicular to the base plane of the field facet mirror. In the case of typical tilts of this type of the field facets in the range of ±3° and an arc radius of curvature of the field facet images of 150 mm, a tangential dimension is produced of the extended region of 15 mm. The radial dimension of the extended region is proportional to a spacing of the object plane from a target superimposed plane spaced apart therefrom, of the field facet images. This target superimposition plane may coincide, for example, with a displacement plane of a correction diaphragm. A UNICOM may be arranged, for example, in the target superimposition plane. The target superimposition plane is also called below a diaphragm or stop plane of a correction diaphragm or stop. In addition, the radial dimension of the extended region is proportional to a numeric aperture of the object field illumination. Assuming typical values for the numerical aperture of the object field illumination, for example NA=0.1, and for the spacing between the object plane and the target superimposition plane, for example 10 mm a value of 1.5 mm is produced for the radial dimension of the extended region.

The extended region may have an extent of between 3 mm and 25 mm, in particular between 5 mm and 20 mm, for the tangential dimension. For the radial dimension, the extended region may have an extent of between 0.5 mm and 3 mm, in particular between 0.75 mm and 2 mm. As the object plane, on the one hand, and the target superimposition plane, on the other hand, are closely adjacent to one another, it is unimportant in practice in considering the dimension above, whether the extended region is observed in the target superimposition plane or in the object plane.

In an illumination optics, via the orientation of the transmission facets to image the centres of the reflection surfaces of the field facets onto a region extended along the long field extent in the centre of the object field, a compensation of a tilting effect of the imaging of arcuate field facets into the object field can surprisingly be achieved. According to the disclosure, it was recognised that a tilted arc is also still very similar to the original arc if the condition is given up that all the centres of the facet arcs in the object field have to be precisely imaged on one another. With surprisingly little outlay, good compensation of a tilting imaging effect of the following optical system is produced without a relatively large intervention into the structure of a conventional field facet mirror with curved field facets being used for this purpose.

A superimposition arrangement can allow the use of a correction mechanism influencing the intensity of the object field illumination from the more sharply superimposed edge, so an undesired effect on an illumination angle distribution when using this correction mechanism is minimised. The superimposition may be optimised in the object plane or alternatively also in a displacement plane of the correction mechanism, which does not have to coincide with the object plane.

The advantages of an illumination system, a projection exposure apparatus, a production method, and a microstructured component can correspond to those which were already discussed above with reference to the field facet mirror according to the disclosure.

BRIEF DESCRIPTION OF THE DRAWINGS

An embodiment of the disclosure will be described in more detail below with the aid of the drawings, in which:

FIG. 1 schematically shows a projection exposure apparatus 1 for EUV microlithography. An EUV radiation source is used as the light source 2. This may be an LPP (laser produced plasma) radiation source or a DPP (discharge produced plasma) radiation source. The light source 2 emits EUV useful radiation 3 at a wavelength in the range between 5 nm and 30 nm. The useful radiation 3 will also be called illumination or imaging light below.

Figure 1:
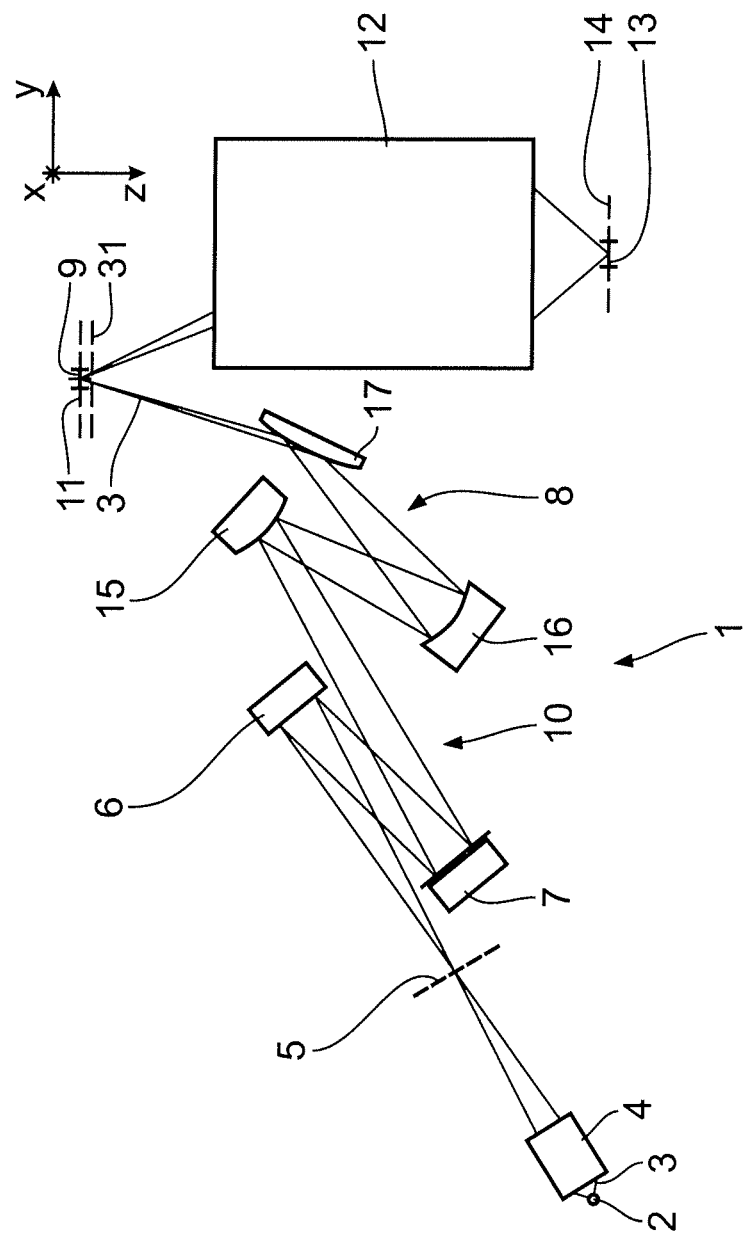
FIG. 1 schematically shows a projection exposure apparatus for EUV microlithography, an illumination optics being shown in meridional section.

The illumination light 3 emitted by the light source is firstly collected in a collector 4. This may be, depending on the type of light source 2, an ellipsoidal mirror or a nested collector. After the collector, the illumination light 3 passes through an intermediate focus plane 5 and then impinges on a field facet mirror 6, which will be described in detail below. From the field facet mirror 6, the illumination light 3 is reflected toward a pupil facet mirror 7. The illumination light bundle is divided into a plurality of illumination channels via the facets of the field facet mirror 6, on the one hand, and the pupil facet mirror 7 on the other hand, one pair of facets with a field facet or a pupil facet being precisely allocated to each illumination channel.

A following optics 8 arranged downstream of the pupil facet mirror 7 guides the illumination light 3, in other words the light of all the illumination channels, toward an object field 9. The field facet mirror 6, the pupil facet mirror 7 and the following optics 8 are components of an illumination optics 10 for illuminating the object field 9. The object field 9 is arcuate or part circle-shaped or part ring-shaped, as will be described below. The object field 9 lies in an object plane 11 of a projection optics 12, which is arranged downstream of the illumination optics 10, of the projection exposure apparatus 1. A structure arranged in the object field 9 on a reticle, not shown in the drawing, in other words on a mask to be projected, is imaged by the projection optics 12 on an image field 13 in an image plane 14. A wafer, also not shown in the drawing, onto which the structure of the reticle is transmitted to produce a microstructured or nanostructured component, for example a semiconductor chip, is arranged at the site of the image field 13.

The following optics 8 between the pupil facet mirror 7 and the object field 9 has three further EUV mirrors 15, 16, 17. The last EUV mirror 17 before the object field 9 is designed as a mirror for grazing incidence. In alternative embodiments of the illumination optics 10, the following optics 8 may also have more or less mirrors or even be dispensed with completely. In the latter case, the illumination light 3 is guided from the pupil facet mirror 7 directly to the object field 9.

To facilitate the illustration of the position relationships, an xyz-coordinate system is used below. In FIG. 1, the x-direction runs perpendicularly to the plane of the drawing into the latter. The y-direction, in FIG. 1, runs to the right and the z-direction runs downward in FIG. 1. If in FIG. 2 et seq. a Cartesian coordinate system is also used, this in each case spans the reflection surface of the component shown. The x-direction is then parallel to the x-direction in FIG. 1 in each case. An angle relationship of the y-direction of the individual reflection surface to the y-direction in FIG. 1 depends on the orientation of the respective reflection face.

Figure 2:
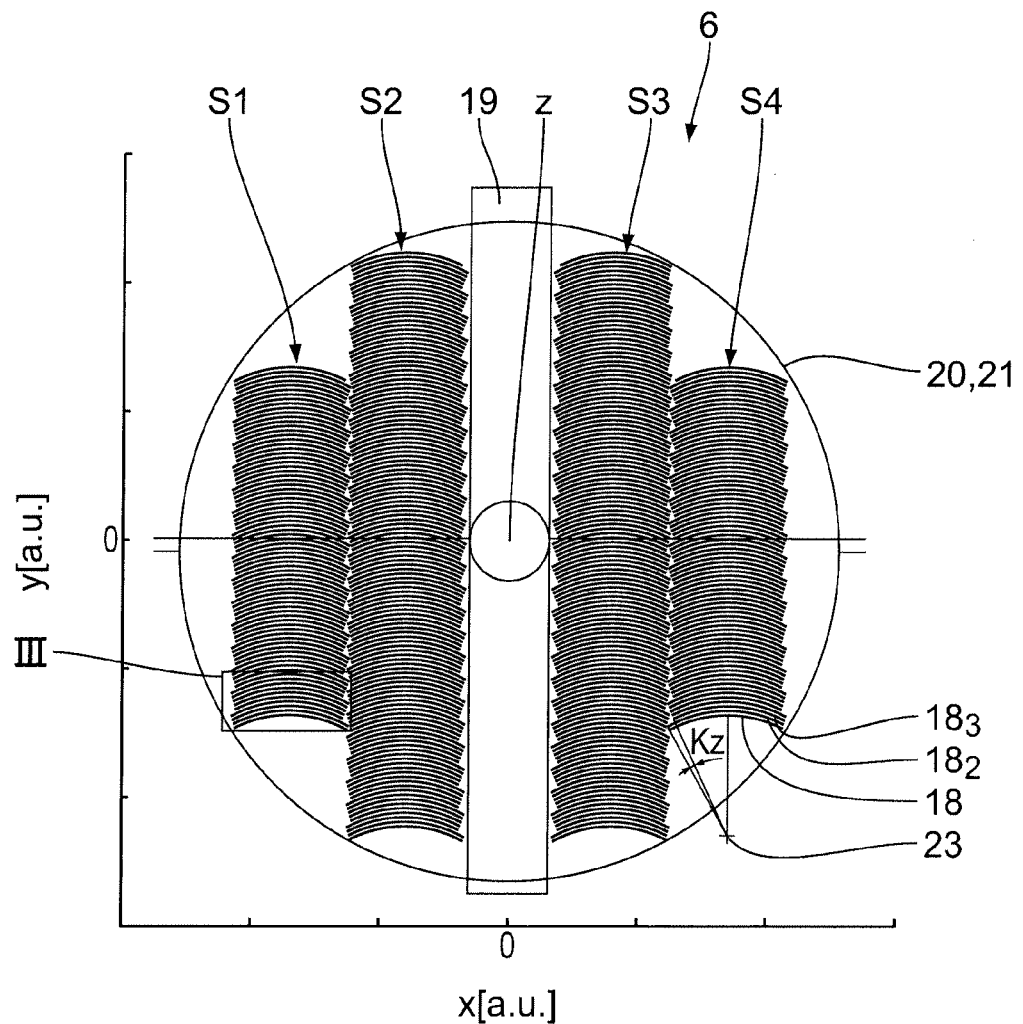
FIG. 2 shows a plan view of a field facet mirror of the illumination optics according to FIG. 1.

FIG. 2 shows the field facet mirror 6 in more detail. This has a total of four individual field facets 18 arranged in columns S1, S2, S3, S4, which are numbered consecutively from the left to the right in FIG. 2. The two central columns S2 S3 are separated from one another by an installation space 19, which runs in the y-direction and has a constant x-extent. The installation space 19 corresponds to a remote field shading of the illumination light bundle, which is structurally caused by the structure of the light source 2 and the collector 4. The four facet columns S1 to S4 in each case have a y-extent, which ensures that all four facet columns S1 to S4 are within a circularly limited remote field 20 of the illumination light 3. The edge of a support plate 21 for the field facets 18 coincides with the edging of the remote field 20.

Reflection surfaces 22 of the field facets 18 have an arcuate or part ring shape congruent to one another, in relation to a projection onto the xy-plane, in other words in relation to a main reflection plane of the field facet mirror 6, which is similar to the shape of the object field 9.

The object field 9 has an x/y-aspect ratio of 13/1. The x/y-aspect radio of the field facets 18 is greater than 13/1. Depending on the configuration, the x/y-aspect ratio of the field facets 18 is 26/1, for example, and is generally greater than 20/1.

In total, the field facet mirror 6 has 416 field facets 18. Alternative configurations of field facet mirrors 6 of this type may have numbers of field facets 18 in the region of between a few tens and a thousand, for example.

The field facets 18 have an extent in the y-direction of about 3.4 mm. The extent of the field facets 18 in the y-direction is, in particular, greater than 2 mm.

The total of all the 416 field facets 18 has a packing density of 73%. The packing density is defined as the sum of the illuminated reflection surfaces 22 of all the field facets 18 in relation to the face illuminated in total on the support plate 21.

Figure 3:
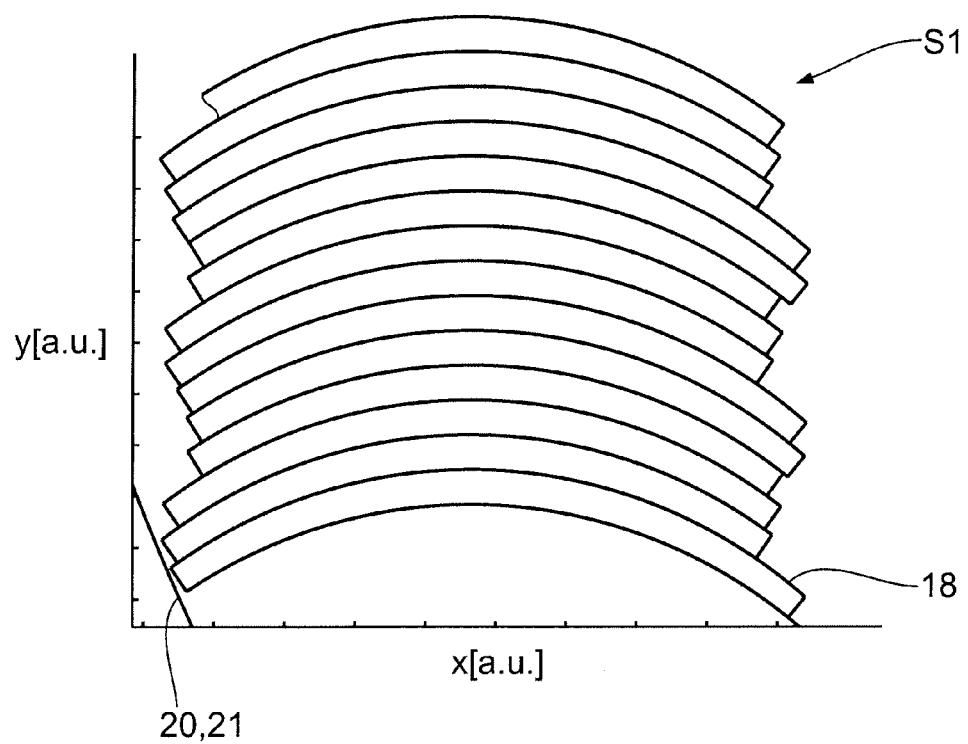
FIG. 3 schematically shows a detail enlargement according to the detail III in FIG. 2.

FIG. 3 shows a detail enlargement of the field facet mirror 6 in an end region of the facet column S1. Adjacent field facets 18 are arranged tilted with respect to one another by more than 1° about an axis, which runs perpendicular to the main reflection plane of the field facet mirror 6, in other words parallel to the z-axis in FIG. 2.

This is shown in FIG. 2 using the example of the second field facet $18_2$ from the bottom in the facet column S4 in comparison to the third field facet $18_3$ from the bottom in column S4. These two field facets $18_2$, $18_3$ are tilted with respect to one another about a tilting angle Kz of about 2° about an axis 23, which is perpendicular to the plane of the drawing of FIG. 2, in other words perpendicular to the main reflection plane of the field facet mirror 6. A larger tilting angle Kz is also possible. This means that the field facet $18_2$ projects relative to the field facet $18_3$ at the left-hand edge, in other words projects in the negative x-direction, while the field facet $18_3$ projects relative to the field facet $18_2$ by the same amount at the right-hand edge, in other words in the positive x-direction. Corresponding projections between adjacent field facets 18 can be inferred from the detail enlargement of FIG. 3. The tilting angle Kz between adjacent field facets 18 vary in the range between ±3°.

The tilting axes 23, by which the tilting angle Kz of respectively adjacent field facets 18 is defined with respect to one another are located centrally between the ring centres which are allocated to these two part ring-shaped field facets 18. The adjacent field facets 18 are thus tilted with respect to one another about the axis 23, which approximately coincides with the ring centres. The tilt of adjacent field facets 18 with respect to one another about the axis 23 defined via the position of the respective ring centres of these field facets 18 is also designated the tilt Z below. A tilting angle Kz is allocated to this tilt Z in each case.

Figure 4:
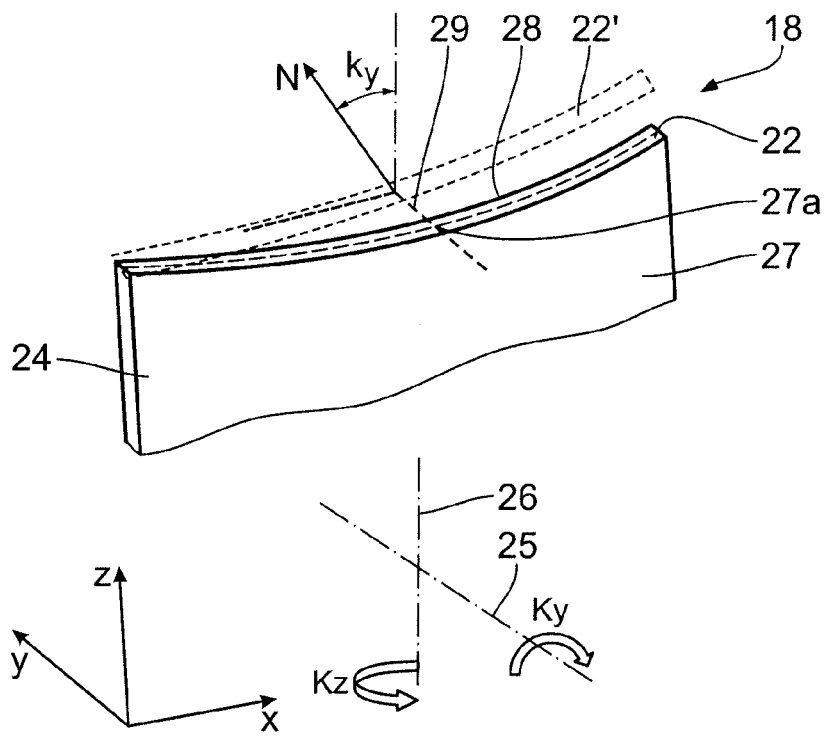
FIG. 4 shows an individual one of the field facets of the field facet mirror according to FIG. 2, enlarged, perspectively and broken.

FIG. 4 shows details of the structure of one of the field facets 18. The reflection surface 22 in the x-direction has an extent of about 60 mm. The facet base body 24 continues remote from the reflection surface 22 in the manner not shown in more detail in FIG. 4.

The reflection surface 22 has a multilayer coating, which increases the reflectivity, with alternating molybdenum and silicon layers.

The facet base body 24 is convexly/concavely limited by two opposing spherical side walls 27, 28, arranged substantially perpendicular to the y-axis. The side wall 27 facing the observer of FIG. 4 is convex and the opposing side wall 28 remote from the observer of FIG. 4 is concave.

If one is limited to a design of this type of a facet base body 24, in which the side walls 27, 28 are cylinder faces displaced in parallel, projections of the reflection surfaces 22 of facet base bodies 24 of this type onto a base plane xy, which is spanned by the arrangement of the field facets 18 next to one another, are limited by part circles displaced in parallel. The direction of the radially extending parallel displacement of the inner part circle defined by the concave side wall 28 to the outer part circle defined by the convex side wall 27 is individual for each of the field facets 18. An angle between these parallel displacement directions and the y-axis corresponds to the respective tilting angle Kz. The side walls 27, 28 of the facet base body 24 may also be spherical faces displaced in parallel.

The reflection surface 22 is configured as one of a total of four end walls of the facet base body 24. The reflection surface 22 may be planar or else, in accordance with predetermined imaging specifications, curved, for example spherical, aspherical or as a freeform face.

FIG. 4 shows a further tilting possibility of adjacent field facets 18 with respect to one another, namely a tilting about a further tilting axis 25 parallel to the y-axis, which will also be called the tilt Y below. The tilting axis 25 runs parallel to a radius, which is predetermined by the part ring shape of the reflection surface 22 of the field facet 18. Because of the tilt Y, there is an angle deviation of a normal N to the tilted reflection surface (cf. 22') in FIG. 4. This tilt Y deviation about a tilt angle Ky is shown very exaggerated in FIG. 4. A tilt Y of this type can be used for the correct orientation of the reflection surface 22 of the respective field facet 18 or also in conjunction with the production of the field facet mirror 6. In principle, it is possible via the tilt Y to being about an allocation of the respective field facet 18 to the associated pupil facet of the pupil facet mirror 7.

As an alternative to a tilt about a tilting angle Kz, as described in conjunction with FIG. 2, it is also possible to tilt the field facets 18 about a tilting axis 26 also parallel to the z-axis (cf. FIG. 4), which also extends through a centre 27a of the reflection surface 22. A tilting of this type about the tilting axis 26 also leads to a tilt Z of the field facet 18.

Figure 5:
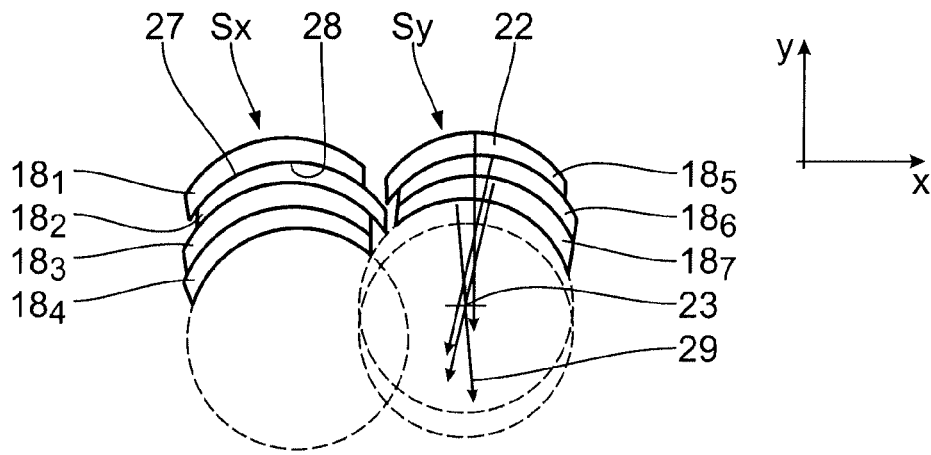
FIGS. 5 to 8 in each case show a plan view of various embodiments of field facets arranged group-wise for use in the field facet mirror according to FIG. 2 and examples of the adjacent arrangement thereof.

FIG. 5 again schematically shows the tilting of adjacent field facets 18 about the tilting axes 23 respectively defined with respect to these. Sections of two adjacent columns Sx and Sy are shown in FIG. 5. In total, four field facets $18_1$ to $18_4$ of the column Sx, the index of which is numbered consecutively from the top to the bottom, and a total of three field facets $18_5$ to $18_7$ of the column Sy, the index of which is also numbered consecutively from the top to the bottom, are shown in FIG. 5. The field facets $18_1$ to $18_7$ each in turn have an arcuate or part ring-shape.

Not all the field facets $18_1$ to $18_7$ in relation to their projection onto the main reflection plane xy of the field facet mirror 6 have a part ring-shape which is congruent to one another. Thus, the field facet $18_2$ passes over a larger peripheral angle than the field facet $18_1$ arranged thereabove and has a larger extent in the x-direction than the field facet $18_1$.

Mutually facing side walls 27, 28 of the field facets $18_1$ to $18_4$, on the one hand, and of the field facets $18_5$ to $18_7$ on the other hand, in each case have the same radius of curvature.

Effective tilting angles Kz of the field facets $18_5$ to $18_7$ with respect to one another are indicated in FIG. 5 by arrows 29. Three of the arrows 29 shown are extensions of the centre symmetry radii of the respective field facets $18_5$ to $18_7$. The respective centre symmetry radius is the coinciding radius of the two concave or convex side walls 28, 27 of one of the field facets 18. These symmetry radii are also characterised by the reference numeral 29 in the drawing. A representative tilting axis 23 is also shown.

The radii of curvature of some of the side walls 27, 28 of the field facets 18 are indicated by dashed circles in FIG. 5.

Figure 6:
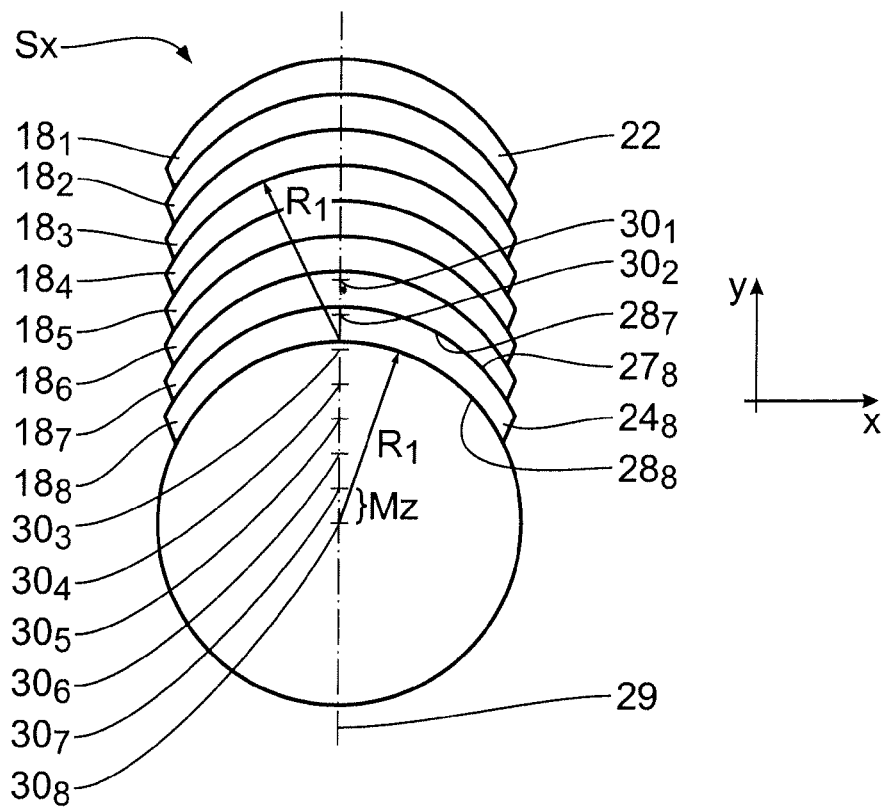

FIG. 6 shows a further arrangement of adjacent field facet mirrors $18_1$ to $18_8$ within a facet column Sx. The spherically concave side wall $28_8$ of the field facet $18_8$ shown at the very bottom in FIG. 6 has a radius of curvature with the amount $R_1$, proceeding from a centre $30_8$. The spherically convex side wall $27_8$ of the field facet $18_8$ has a radius of curvature, also with the amount $R_1$, proceeding from a centre $30_7$, which is arranged offset with respect to the centre $30_8$ about a centre thickness Mz of the facet base body $24_8$ of the field facet $18_8$ in the positive y-direction. The centre $30_7$ is simultaneously the centre for the curvature of the concavely spherical side wall $28_7$ of the field facet $18_7$, which is adjacent to the field facet $18_8$. Accordingly, the other side walls $27_1$ to $27_7$ and $28_1$ to $28_6$ of the other field facets $18_1$ to $18_8$ shown in FIG. 6 are also defined by centres $30_1$ to $30_7$ which are in turn spaced apart from one another in each case by the spacing Mz in the positive y-direction.

Figure 7:
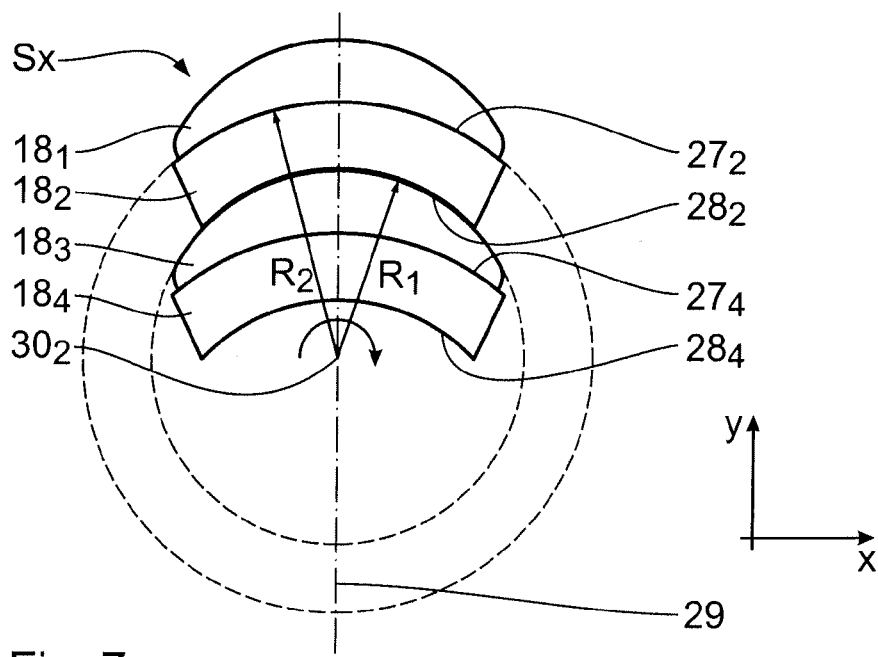

Thus, in the embodiment according to FIG. 6, all the side walls $27_1$ to $27_8$, $28_1$ to $28_8$ with regard to amount have the same radius of curvature $R_1$. The side walls $27_x$, $28_x$ of one of the facet mirrors $18_x$, in the embodiment according to FIG. 6, do not run concentrically, but the centre points $30_x$ of curvature of the two side walls $27_x$, $28_x$ of the respective field facet mirror $18_x$ are offset with respect to one another by the thickness of the reflection surface in the y-direction. FIG. 7 shows an alternative embodiment of field facets 18 arranged adjacent within a column S. In FIG. 7, four field facets $18_1$ to $18_4$ are shown above one another. Two of the four field facets 18 shown in FIG. 7, namely the field facets $18_2$ and $18_4$ have opposing side walls $27_2$, $28_2$ or $27_4$, $28_4$, which have different radii $R_2$, $R_1$ of curvature and are concentric. This is illustrated in more detail in FIG. 7 with the aid of the curvature of the side walls $27_2$, $28_2$ of the field facet $18_2$. The spherically concave side wall $28_2$ has a radius of curvature with the amount $R_1$, proceeding from a centre $30_2$. Proceeding from the same centre $30_2$, the spherically convex side wall $27_2$ of the field facet $18_2$ has a radius of curvature with the amount $R_2$, $R_2$ being greater than $R_1$.

The two further field facets $18_1$, $18_3$ shown in FIG. 7 have convex/concave side walls $27_1$, $28_1$ or $27_3$, $28_3$, which have different radii of curvature and are in addition not concentric. The arrangement of the facets $18_x$ in the column Sx according to FIG. 7 is such that, in each case, a field facet 18 with concentric side walls 27, 28 alternates with a field facet 18 with non-concentric side walls 27, 28, which also have different radii of curvature.

Figure 8:
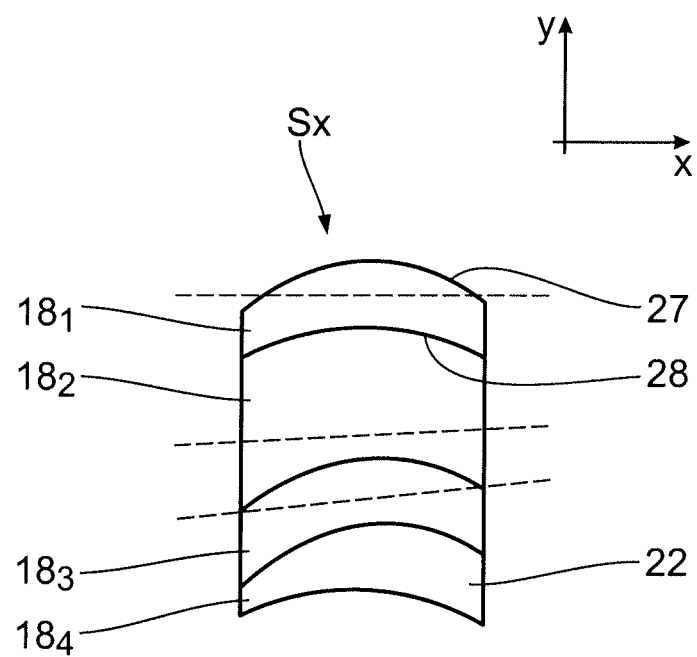

FIG. 8 shows a facet column Sx with field facets $18_1$ to $18_4$, the opposing side walls 27, 28 of which are not concentric. In addition, centres, by which the spherical side walls 27, 28 of the field facets $18_1$ to $18_4$ according to FIG. 8 are defined, are also offset with respect to one another in the x-direction, from case to case. The reflection surfaces of the field facets $18_1$ to $18_4$ according to FIG. 8 in each case form part rings with a y-thickness varying in the peripheral direction. The y-thickness of the reflection surface 22 of the field facet $18_4$ in FIG. 8 increases continuously from the left to the right. The y-thickness of the reflection surface 22 of field facet $18_2$ in FIG. 8 decreases continuously from the left to the right. Thicknesses of the field facets $18_1$ to $18_4$ in the y-direction are shown sharply exaggerated in FIG. 8. Lines running at an acute angle to the x-axis and representing the tilting angle Kz of the field facets $18_1$, $18_2$ and $18_3$ are indicated by dashed lines in FIG. 8.

Figure 9:
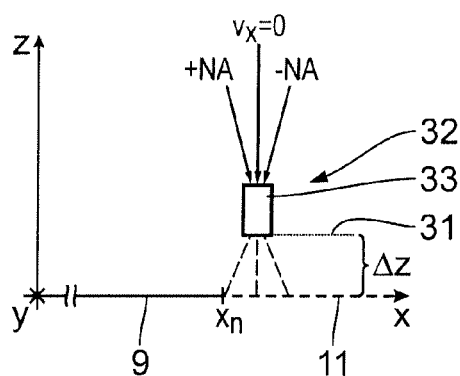
FIG. 9 shows illumination conditions at the edge of an object field illuminated by the illumination optics at the site of an intensity monitoring sensor in a meridional section comparable to FIG. 1 rotated through 180° about an x-axis and through 90° about a z-axis.

Illumination conditions in the region of the object field 9 and in the region of the object plane 11 will be described below with the aid of FIGS. 9 to 11. Arranged in a detection plane 31, which is spaced apart from the object plane 11 by a spacing Δz and lies in the beam direction of the illumination light 3 upstream of the object plane 11, is a detection device 32 with two EUV intensity sensors 33 of which one is shown schematically in FIG. 9. FIG. 9 shows, in an enlarged manner, the edge of the object field 9 in the case of positive x-values.

To illuminate the object field 9, the latter can be used independently of an illumination angle within the numeric aperture NA of the illumination light 3 up to an x-value $x_n$ for projection exposure. With radiation from the direction −NA the sensor 33 shown in FIG. 9 shades the object field 9 in the case of x-values, which are greater than $x_n$. So that the sensor 33 is still acted upon from the beam direction −NA, the illumination light bundle in the object plane 11 in the x-direction has to have an extent up to $x_{-NA}$, wherein $x_{-NA} > x_n$ applies. So that illumination light 3, which impinges on the sensor 33 shown in FIG. 9 precisely in the z-direction ($v_x=0$), there has to be an illumination up to the value $x_0$ in the object plane 11, wherein $x_0 > x_{-NA}$ applies. So that illumination light which falls below the illumination angle +NA reaches the sensor 33 shown in FIG. 9, an illumination up to the x-value $x_{+NA}$ has to take place in the object plane 11, wherein $x_{+NA} > x_0$ applies. This is shown schematically in FIG. 10, which shows the illumination of the object field 9 beyond the edge thereof at values $\pm x_n$. With different point views, the corners of the object field illumination required in the x-direction are shown so that an illumination of the sensor 33 is ensured in the case of radiation from the illuminations direction −NA, $v_x=0$ and +NA. The corners with respect to the illumination direction −NA, which in the case of positive x-values have the smallest x-spacing from the usable field edge $x_n$, in the case of negative x-values, have the greatest x-spacing from the usable field edge $-x_n$. In the case of the corners with respect to the illumination direction +NA this is precisely the reverse. The corner points with respect to the illumination direction $v_x=0$ on both sides of the object field 9 have the same x-spacing with respect to the usable field limits $\pm x_n$.

Accordingly, the field facets 18, the shape of which is superimposed imaged on the object field 9, have to have, as a function of the illumination angle, in other words as a function of the allocation thereof to the respective pupil facets of the pupil facet mirror 7, various extents in the x-direction, so that an illumination of the sensors 33 is in each case just fulfilled without loss of light as a function of the illumination angle. These various extents of the field facets 18 in the x-direction to illuminate the sensors 33 are achieved by an asymmetry achieved in the x-direction of certain of the field facets 18 about the central symmetry radius in the x-direction.

The illumination of the sensors 33 is thus achieved independently of the tilting angle Kz by an adaptation of the azimuthal extent of the individual field facets 18 on both sides of the centre symmetry radius 29. Measured from the centre symmetry radius, the field facets 18 have an unequal x-extent to either side as well as an unequal extent in the azimuthal direction about the respective tilting axis 23.

Figure 10:
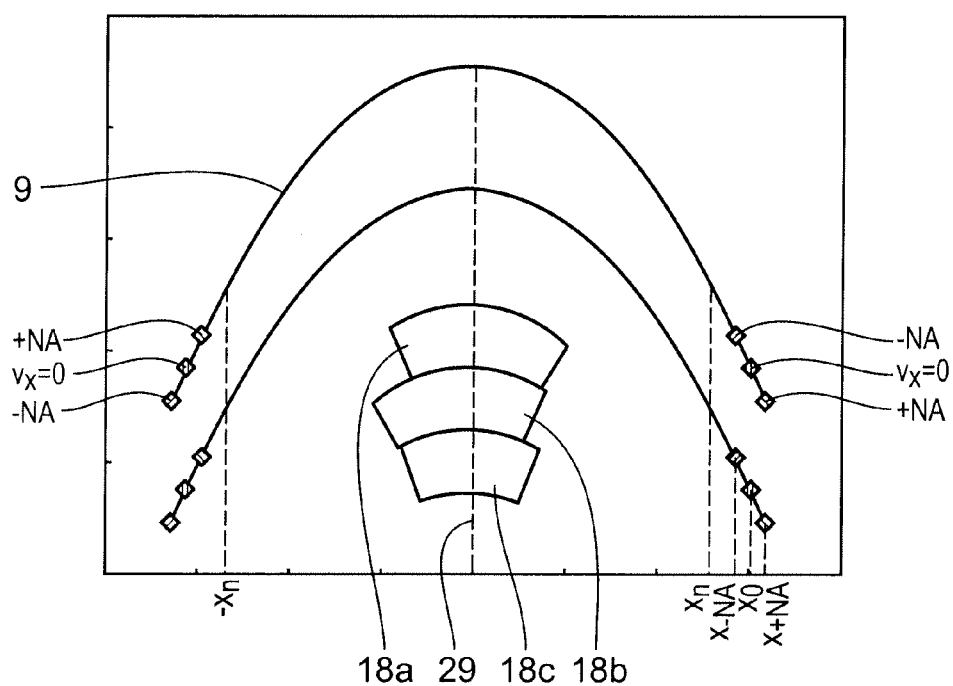
FIG. 10 shows a plan view of the object field, the edge illumination thereof being emphasised for various illumination directions.

In an insert, FIG. 10 shows the shape of the projections of asymmetrised field facets 18a, 18b and 18c of this type. All three field facets 18a to 18c have one and the same centre symmetry radius 29. Proceeding from this, the uppermost field facet 18a shown in FIG. 10 to the right passes over a larger azimuth angle than to the left. The field facet 18b shown in the centre in FIG. 10 to the left passes over a larger azimuth angle than to the right. The field facet 18c shown at the very bottom in FIG. 10 in both directions passes over approximately the same azimuth angle. Reference is made to the fact that all the three field facets 18a to 18c have the same tilting angle Kz.

Figure 11:
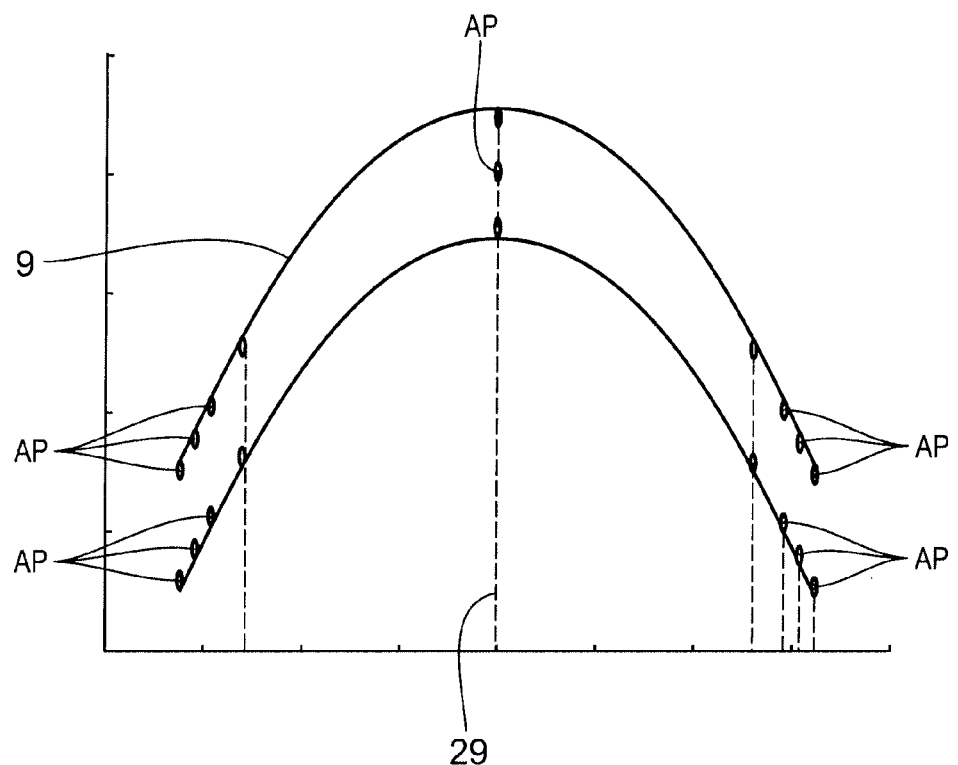
FIG. 11 shows a superimposition of the illumination of the object field proceeding from a predetermined test point pattern onto the field facets in an arrangement according to FIG. 2 in a view similar to FIG. 10.

FIG. 11 shows the superimposition of field facets 18 tilted with respect to one another according to the arrangement of FIG. 2 with tilt Z in the object field 9. The superimposition is shown of selected illumination points AP, on the one hand, in the region of the centre of the respective field facet 18 and, on the other hand, in the region of the two sides of the field facets 18. FIG. 11 shows that the same positions on the various field facets 18 in the arrangement according to FIG. 2 in the object field 9 are also superimposed in the region of the edges of the object field 9 on the same positions.

An undesired scattering, in other words a deviation of the images of the same facet point of various facets in the object plane 11 does not take place.

This practically perfect superimposition of the images of the field facets 18 in the object field 9 is a direct consequence of the fact that the projections of the reflection surfaces 22 of the various field facets 18 on the base plane xy differ in at least one of the following parameters: size of the reflection surfaces 22, shape of the reflection surfaces 22, orientation of the reflection surfaces 22. This difference leads to a pre-compensation, so the individual imaging of the different reflection surfaces 22 in the object field 9 with the tilting thus taking place, the change in the size thus taking place and the shape change thus taking place, leads precisely to the perfect superimposition of the field facets 18 in the object field 9 shown in FIG. 11.

Figure 12:
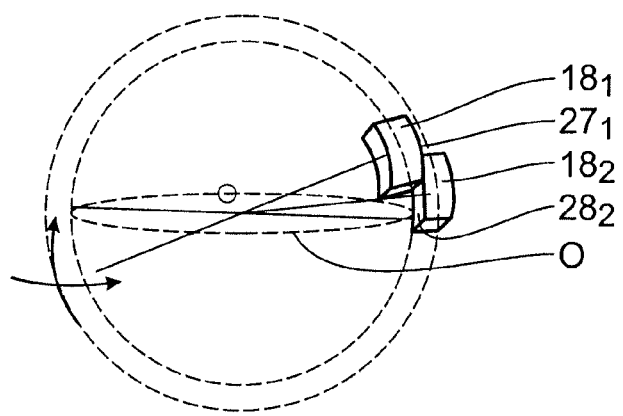
FIG. 12 schematically shows a view of two field facets which are adjacent and arranged tilted with respect to one another to show possible tilting angles.

FIG. 12 illustrates the possibilities of a tilting of two field facets $18_1$, $18_2$, the mutually facing side walls $27_1$, $28_2$ of which are arranged concentrically with the same radius of curvature. Any tilt on the surface defined thereby about a centre O is possible. The associated tilting axis may run in any direction. This tilting axis runs through the centre O.

Figure 13:
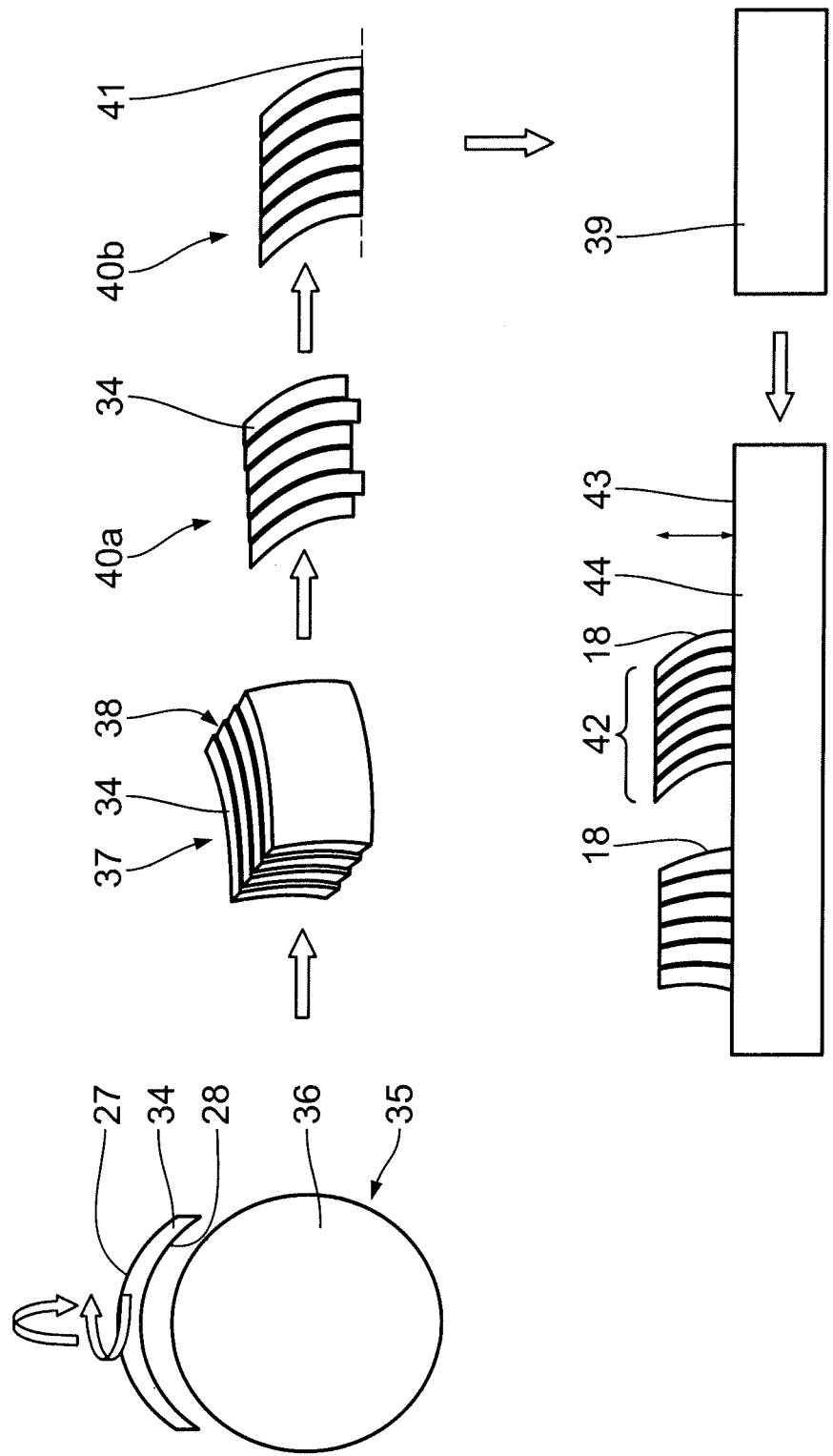
FIG. 13 schematically shows a sequence in the production of a field facet mirror with field facets, side walls facing one another of adjacent facet base bodies having the same radius of curvature.

FIG. 13 schematically shows the sequence of a method for producing a facet mirror 6 in the manner of that of FIG. 2. Firstly, individual crude field facets 34 with spherical side walls 27, 28 are produced (cf. method step 35, in which a spherical grinding body 36 to produce the side walls 28 is indicated). In a method step 37, the individual crude field facets 34 are then allocated to a field facet stack 28, in which respective mutually associated side walls 27, 28 of adjacent facet base bodies 24 have the same radius of curvature.

The individual reflection surfaces 22 of the crude field facets are processed individually, in other words optically polished and provided with the reflection multi-layer.

After the allocation in step 37 and before the individual processing (step 39) in a method step 40, a block is assembled of the crude field facets 34 (step 40a) and then a base face 41 of the block of the crude field facets 34 is ground to a planar reference face. After the individual processing 39, an assembly of a respective group of the field facets 18 into a facet block 41 then takes place, the reference face 41 being placed on a planar counterface 43 of a mirror holding structure 44.

A further configuration of a field facet mirror 6 with field facets 18 tilted with respect to one another individually in each case about a tilt Z is described below with the aid of FIGS. 14 and 15. Components, functions and production method steps, which correspond to those which were already described above with reference to FIGS. 1 to 13, have the same reference numerals and are not discussed in detail again.

Figure 14:
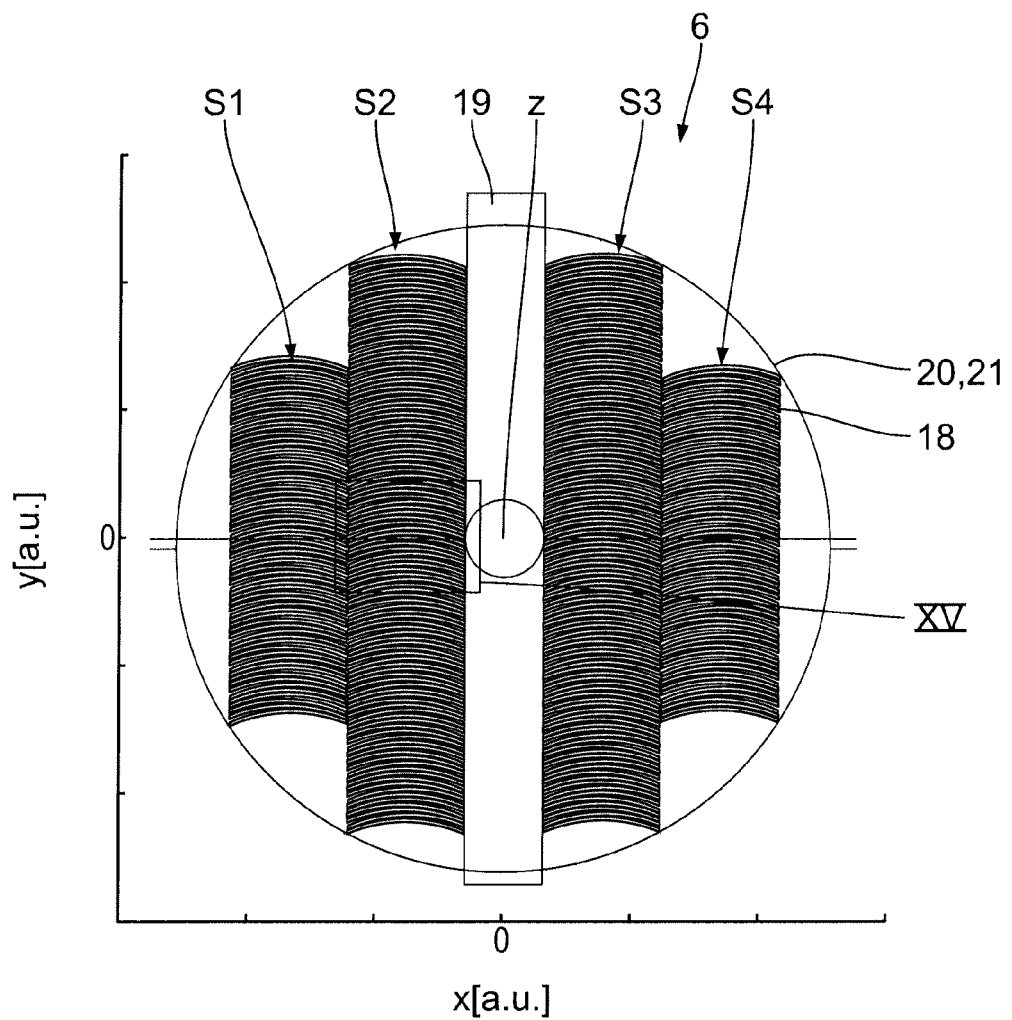
FIG. 14 shows a further embodiment of a field facet mirror for use in the illumination optics according to FIG. 1 in a view similar to FIG. 2.
Figure 15:
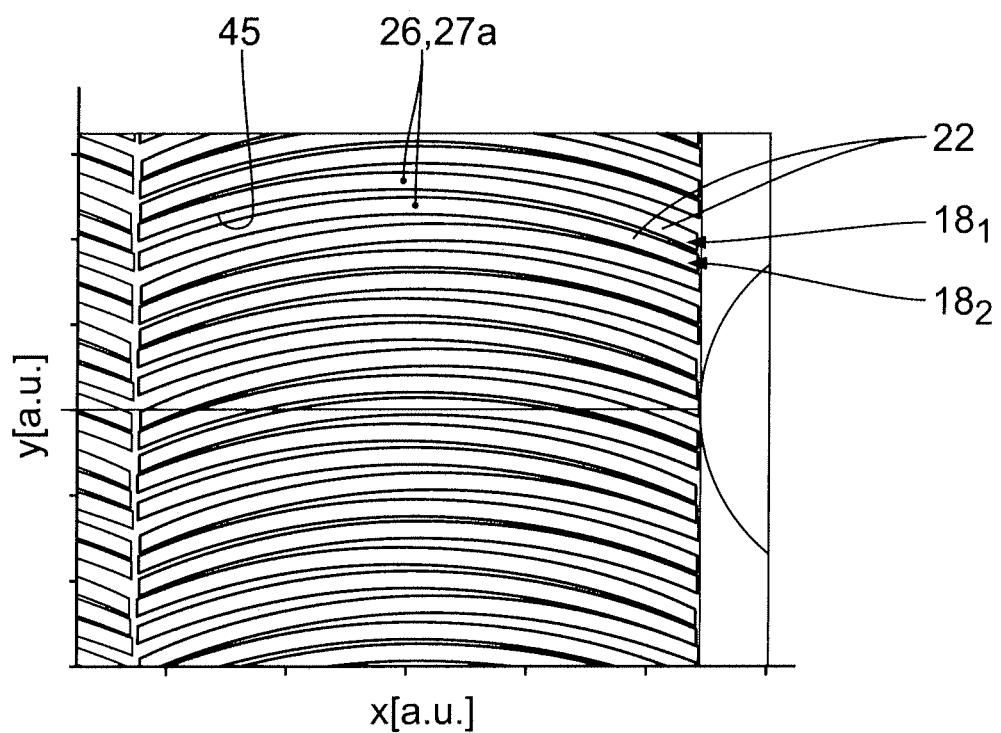
FIG. 15 shows a detail enlargement according to the detail XV in FIG. 14.

The field facet mirror 6 according to FIGS. 14 and 15 has a total of 299 field facets 18. The totality of these 299 field facets 18 has a packing density of 56%. The packing density, which is also called the degree of filling, relates to the total illuminated surface of the field facet mirror 6. The packing density is produced from the sum of the reflection surfaces 22 of the field facets 18 used for reflection divided by the area of the total and, in the present case, elliptical illumination area of the field facet mirror 6, which is specified in FIG. 14 by the edging of the remote field 20. The illumination area without the installation space 19, in other words without shadings of the remote field 20, which are caused by components upstream of the field facet mirror 6, is inserted into the denominator of the packing density here.

The basic structure of the field facet mirror 6 according to FIG. 14 corresponds, even with regard to the arrangement of the field facets 18 in four columns S1 to S4, to the structure of the field facet mirror 6 according to FIG. 2. In the field facet mirror 6 according to FIGS. 14 and 15, respective adjacent field facets 18 are pivoted (tilt Z) with respect to one another about a tilting axis 26 running parallel to the z-axis, which extends approximately through the centre 27a of the respective field facet 18. This is described in more detail below with the aid of FIG. 15 and two selected field facets $18_1$, $18_2$. The field facet $18_2$ is arranged in the column S2 in FIG. 15 directly below the field facet $18_1$. Relative to the field facet $18_1$, the field facet $18_2$ is arranged tilted about its centre 27a through about 0.5° counter to the clockwise direction.

Each of the reflection surfaces 22 of the arcuate field facets 18 has a long facet extent in the x-direction and a short facet extent in the y-direction. An intermediate space 45 which changes constantly and in particular strictly monotonically is produced in the embodiment according to FIGS. 14 and 15 along the long facet extent, in other words along the x-direction between the two field facets $18_1$, $18_2$ which are tilted with respect to one another and adjacent over their long facet extent. In the embodiment according to FIGS. 14 and 15, the intermediate space 45 between the two field facets $18_1$, $18_2$ reduces from the left to the right. In the case of other directly adjacent field facets 18 of the field facet mirror 6 according to FIGS. 14 and 15, the intermediate space 45 between these field facets 18 may also increase. In the individual case, directly adjacent field facets 18 in the embodiment of the field facet mirror 6 according to FIGS. 14 and 15 may also be configured with respect to one another about their respective centres 27a without a relative tilt Z. In this case, the intermediate space 45 may also remain constant from the left to the right along the long facet extent.

The tilt angles tilt Z about the tilting axes 26 through the respective centres 27a are located absolutely in the range of −3° to 3°.

One pupil facet of the pupil facet mirror 7 of the illumination optics 10 is rigidly allocated to each of the 299 field facets 18 of the field facet mirror 6 according to FIGS. 14 and 15 via an illumination channel. The pupil facet mirror 7 is a transmission facet mirror and the pupil facets of the pupil facet mirror 7 are transmission facets. This allocation is such that a tilting of the image, caused by imaging, of the respective field facet 18 in the object field 9 is just compensated because of the respective tilting angle tilt Z about the tilting axis 26, which is defined by the respective centre 27a, of the field facet 18, so the images of the field facets 18 superimpose one another practically untilted in the object field 9 despite the tilting imaging effect of the following optics 8.

A further configuration of a field facet mirror 6 with field facets 18 respectively tilted with respect to one another individually about a tilt Z is described below with the aid of FIGS. 16 and 17. Components, functions and production method steps, which correspond to those which were already described above with reference to FIGS. 1 to 15, have the same reference numerals and will not be discussed again in detail.

Figure 16:
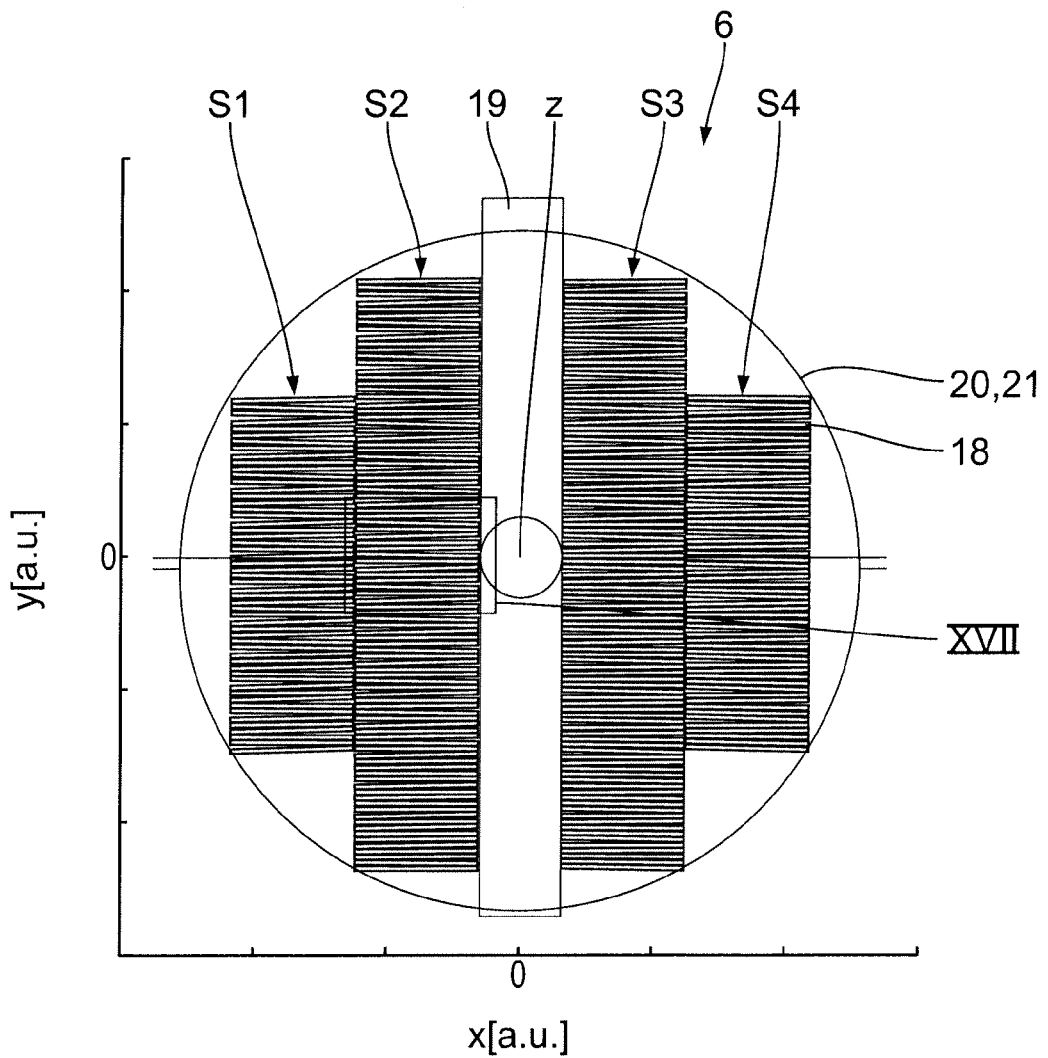
FIG. 16 shows a further embodiment of a field facet mirror for use in the illumination optics according to FIG. 1 in a view similar to FIG. 2.
Figure 17:
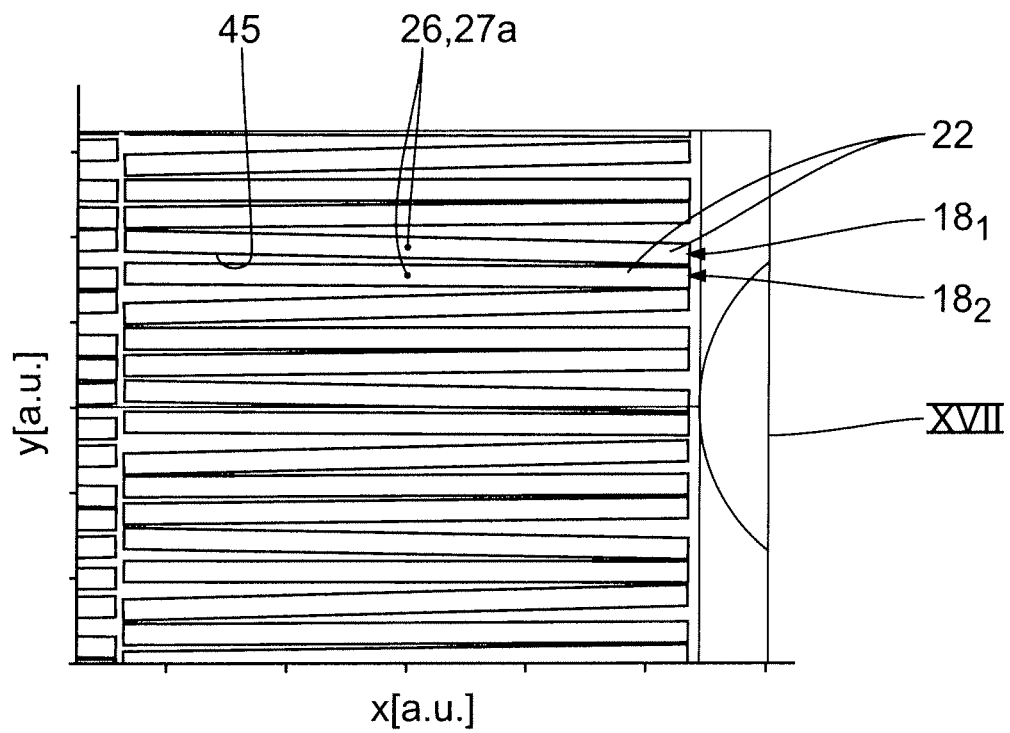
FIG. 17 shows the detail XVII from FIG. 16, enlarged.

The field facet mirror 6 according to FIGS. 16 and 17, except for the fact that the field facets 18 in the field facet mirror according to FIGS. 16 and 17 are not curved, but have rectangular reflection surfaces 22, corresponds to the field facet mirror 6 according to FIGS. 14 and 15. The field facet mirror 6 according to FIGS. 16 and 17 also has 299 field facets 18, which are individually tilted in each case about a tilt Z, to which, in accordance with the tilting effect of the imaging via illumination channels, pupil faces of the pupil facet mirror 7 of the illumination optics 10 are individually allocated.

In the field facet mirror 6 according to FIGS. 16 and 17, the packing density of the field facets 18 is 53%.

With the aid of FIG. 18, further embodiment of an illumination optics 10 will be described below with a field facet mirror 6 and a transmission facet mirror in the form of a pupil facet mirror. Components, functions and production method steps, which correspond to those which were already discussed above with reference to FIGS. 1 to 17, have the same reference numerals and will not be discussed again in detail.

Figure 18:
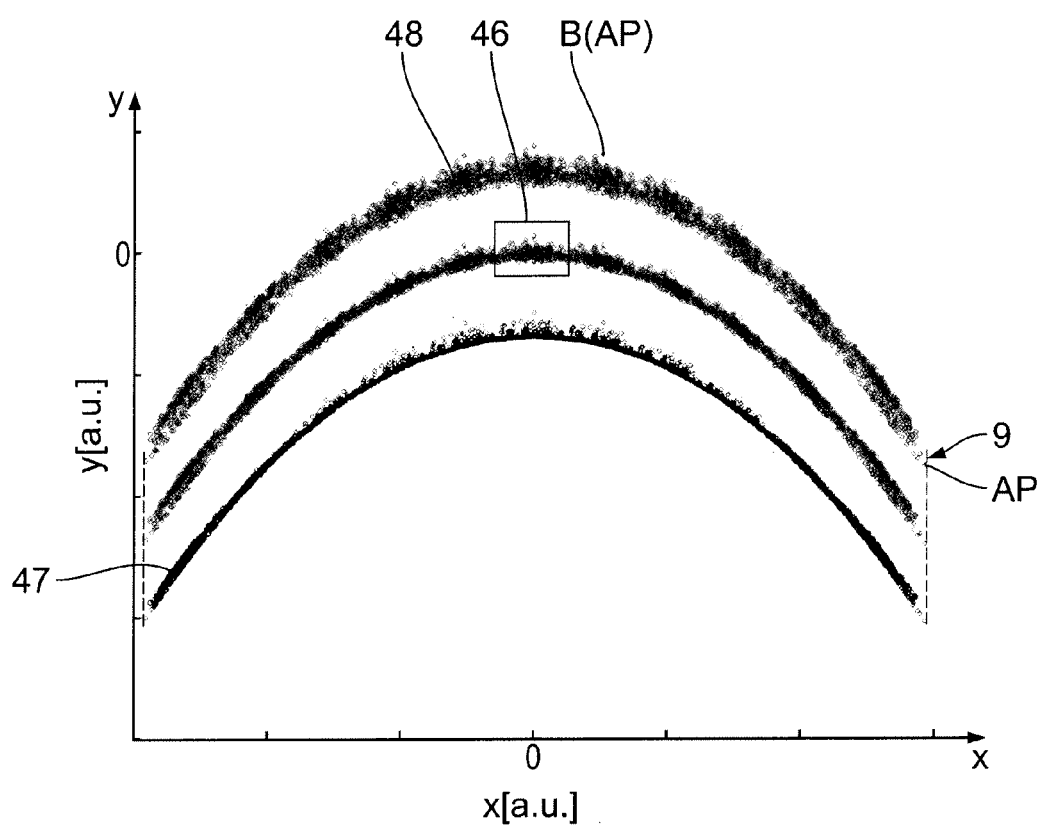
FIG. 18 shows a superimposition of the illumination of the object field by a further embodiment of an illumination optics with a field facet mirror, the reflection surfaces of which are imaged by a transmission facet mirror configured as a pupil facet mirror, in a superimposed manner, into the object field in a view similar to FIG. 11, in a target superimposition plane of a correction diaphragm or stop.

FIG. 18 shows the superimposition of images of selected illumination points AP on the arcuate field facets 18 of the field facet mirror 6 in the manner of FIG. 2 in a diaphragm plane or target superimposition plane, which is described in more detail below, adjacent to the object field 9 and spaced apart from the object field 9. The same grid of illumination points AP is observed on each of the field facets 18 here, specifically an 11×3 grid of three rows equally spaced apart in the y-direction each of 11 illumination points AP spaced apart in the x-direction. The spacing of the illumination points AP in the x-direction is selected such that, in the object field 9, an equidistant grid of the images of the illumination points AP is produced.

In the illumination optics 10, which leads to the superimposition according to FIG. 18, the transmission facets, in other words the pupil facets of the pupil facet mirror 7, are oriented such that the centres 27a of the reflection surfaces 22 of the arcuate field facets 18 are not imaged on one point, but on an extended region 46 (cf. FIG. 18). The centre 27a is in each case the point which is located halfway between the intersections of the respective symmetry radii with the side walls 27, 28 of the respective reflection surface 22.

Figure 19:
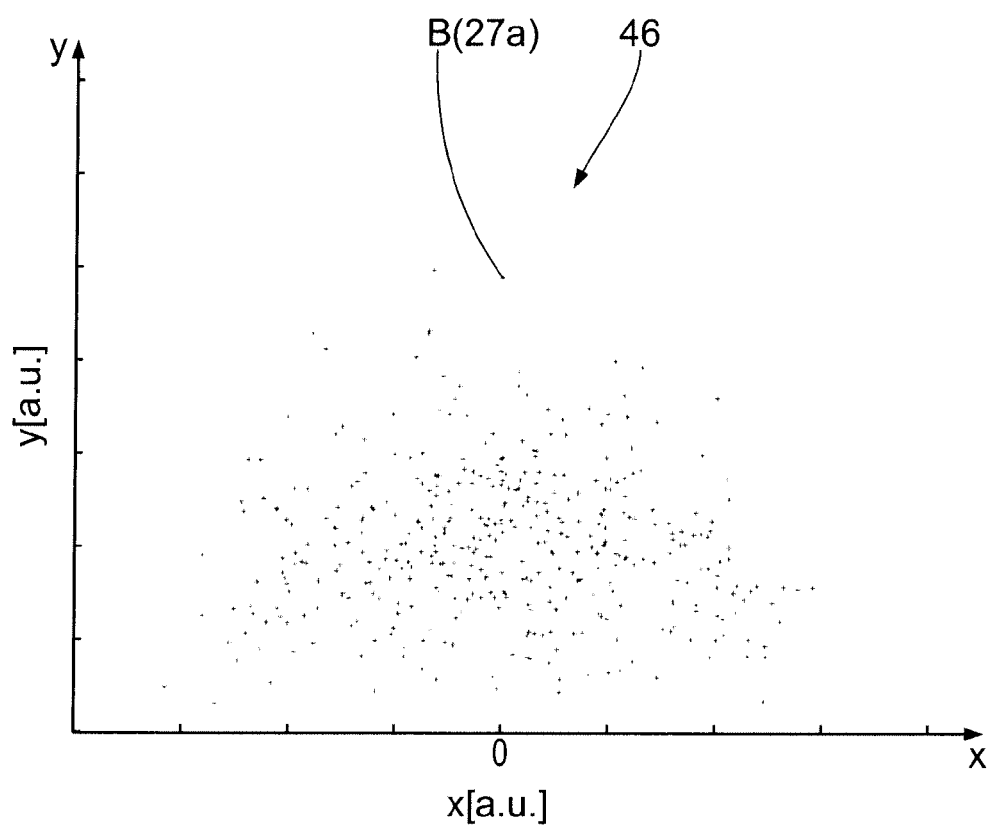
FIG. 19 shows the positions of the images of centres of the reflection surfaces of the field facets of the illumination optics according to FIG. 18 in the object field to a scale which is sharply enlarged compared to the view according to FIG. 18.

FIG. 19 shows the extended imaging region in the centre of the object field in a greatly enlarged view. The region 46 has an extent in the x-direction of a few millimeters and an extent of less than one millimeter in the y-direction. The centre images B(27a) of the central illumination points AP are present scattered in the region 46. This scattering is the result of a corresponding translation of the respective images of the field facets 18, which is caused by a corresponding tilting of the pupil facets in the x- and y-direction.

The individual x- and y-translation by corresponding tilting adjustment of the pupil facets means that a total superimposition of all the field facets in the object field 9, in particular at the field edges in the case of small and large x-values is significantly improved compared to an adjusting specification, in which all the centre images B(27a) are superimposed in a point in the object field 7.

The individual translation in the x- and y-direction, is optimised in the illumination optics 10 according to FIGS. 18 and 19 in such a way that the images of the reflection surfaces 22 of the field facets 18 along the lower edge 47 in FIG. 18 extending along the long field extent x, are imaged more sharply superimposing one another than along the opposing edge 48 along the long field extent, in other words along the x-axis. From the edge 47 via the use, for example, of a plurality of finger diaphragms, an illumination angle-independent intensity correction of the illumination of the object field 9 is possible in the object plane 11 or in the diaphragm plane spaced apart therefrom, for example via a UNICOM known from EP 0 952 491 A1. A diaphragm plane of a correction diaphragm may be spaced apart from the object plane 11, as already mentioned above. In this case, the optimisation in the illumination optics 10 according to FIGS. 18 and 19 may take place by translation in the x- and y-direction such that the images of the reflection surfaces 22 of the field facets 18 along the edge 47 are imaged sharply superimposing one another in the image plane.

The illumination optics 10 according to FIGS. 18 and 19 therefore represents a further possibility for compensating a tilting imaging effect of the following optics 8 by a corresponding configuration of the illumination optics 10 in such a way that, in the object field 7, good superimposition of the field facet images and therefore an optimised illumination is ensured.

Owing to the arrangement variants described above of the field facets 18 of the field facet mirror 6, a transfer of the illumination light 3 which was reflected to illuminate the object field 9 by the field facet mirror 6, is maximised.

To produce a microstructured or nanostructured component, the projection exposure apparatus 1 is used as follows: firstly, the reticle and the wafer are provided. A structure on the reticle is then projected onto a light-sensitive layer of the wafer with the aid of the projection exposure apparatus 1. By developing the light-sensitive layer, a microstructure on the wafer and therefore the microstructured component, is produced.

The projection exposure apparatus 1 is designed as a scanner. The reticle is continuously displaced here in the y-direction during the projection exposure. Alternatively, a configuration as a stepper is also possible, in which the reticle is displaced step-wise in the y-direction.

In the arrangement according to FIG. 7, a tilting adjustment, for example of the field facet $18_2$ about the centre $30_2$ is possible, without the other field facets $18_1$, $18_3$, $18_4$ having to be displaced here.

What is claimed is:

1. An illumination optics, comprising:
   a field facet mirror comprising a plurality of arcuate field facets, each arcuate field facet comprising a reflection surface;
   an optics comprising a transmission facet mirror configured to image the field facets into an object field during use of the illumination optics,
   wherein:
      the transmission facet mirror comprises a plurality of transmission facets;
      each field facet is allocated an individually allocated transmission facet to image into the object field during use of the illumination system;
      the transmission facets are oriented so that, during use of the illumination system, centers of the reflection surfaces of the field facets are imaged on an extended region in the center of the object field; and
      the illumination optics is a microlithography illumination optics.

2. The illumination optics of claim 1, wherein:
   the object field has a long field extent and a short field extent;
   the reflection surfaces have a long facet extent corresponding to the long field extent of the object field;
   the reflection surfaces has a short facet extent corresponding to the short field extent;
   the transmission facets are oriented so that, during use of the illumination optics, centers of the reflection surfaces are imaged on a region extended along the long field extent in the center of the object field.

3. The illumination optics of claim 2, wherein the transmission facets are oriented so that, during use of the illumination optics, images of the reflection surfaces along one of the two edges of the object field, which run along one of the two long field extents, are imaged more sharply superimposed on one another than along the other of these two edges.

4. An apparatus, comprising:
   an illumination optics according to claim 1,
   wherein the apparatus is a microlithography projection exposure apparatus.

5. The apparatus of claim 4, further comprising a projection optics configured to image the object field into the image field.

6. The illumination optics of claim 1, wherein the transmission facet mirror comprises a pupil facet mirror.

7. The illumination optics of claim 6, further comprising at least one mirror between the pupil facet mirror and the object plane.

8. The illumination optics of claim 6, further comprising three mirrors between the pupil facet mirror and the object plane.

9. The illumination optics of claim 8, wherein one of the three mirrors comprises a grazing incidence mirror.

10. A method, comprising:
    using an illumination optics according to claim 1 to illuminate an object in an object field; and
    using a projection optics to project an image of a structure of the object to an image field.

11. An illumination optics, comprising:
    a field facet mirror comprising a plurality of field facets, each field facet comprising a reflection surface;
    a pupil facet mirror configured to image the field facets into an object field during use of the illumination system during use of the illumination optics,
    wherein:
       the pupil facet mirror comprises a plurality of pupil facets;
       each field facet has a corresponding pupil facet to image into the object field during use of the illumination system;
       the pupil facets are oriented so that, during use of the illumination system, centers of the reflection surfaces of the field facets are imaged on an extended region in the center of the object field; and
       the illumination optics is an EUV microlithography illumination optics.

12. The illumination optics of claim 11, wherein:
    the object field has a long field extent and a short field extent;
    the reflection surfaces have a long facet extent corresponding to the long field extent of the object field;
    the reflection surfaces has a short facet extent corresponding to the short field extent;
    the transmission facets are oriented so that, during use of the illumination optics, centers of the reflection surfaces are imaged on a region extended along the long field extent in the center of the object field.

13. The illumination optics of claim 12, wherein the transmission facets are oriented so that, during use of the illumination optics, images of the reflection surfaces along one of the two edges of the object field, which run along one of the two long field extents, are imaged more sharply superimposed on one another than along the other of these two edges.

14. The illumination optics of claim 11, further comprising at least one mirror between the pupil facet mirror and the object plane.

15. The illumination optics of claim 14, further comprising three mirrors between the pupil facet mirror and the object plane.

16. The illumination optics of claim 15, wherein one of the three mirrors comprises a grazing incidence mirror.

17. An apparatus, comprising:
an illumination optics according to claim 11,
wherein the apparatus is an EUV microlithography projection exposure apparatus.

18. The apparatus of claim 17, further comprising a projection optics configured to image the object field into the image field.

19. A method, comprising:
using an illumination optics according to claim 11 to illuminate an object in an object field; and
using a projection optics to project an image of at least a portion of the object to an image field.

20. An illumination optics, comprising:
a field facet mirror comprising a plurality of field facets, each field facet comprising a reflection surface;
an optics comprising a transmission facet mirror configured to image the field facets into an object field during use of the illumination optics,
wherein:
  the transmission facet mirror comprises a plurality of transmission facets;
  each field facet has a corresponding transmission facet to image into the object field during use of the illumination system;
  the transmission facets are oriented so that, during use of the illumination system, centers of the reflection surfaces of the field facets are imaged on an extended region in the center of the object field; and
  the illumination optics is a microlithography illumination optics.

* * * * *

UNITED STATES PATENT AND TRADEMARK OFFICE
CERTIFICATE OF CORRECTION

PATENT NO. : 9,304,406 B2
APPLICATION NO. : 14/251100
DATED : April 5, 2016
INVENTOR(S) : Adrian Staicu and Martin Endres It is certified that error appears in the above-identified patent and that said Letters Patent is hereby corrected as shown below:

Specification

Col. 7, line 43, delete "S2 S3" and insert -- S2, S3 --.

Col. 7, line 60, delete "radio" and insert -- ratio --.

Col. 10, line 19, delete "S." and insert -- $S_x$. --.

Col. 11, line 6, delete "$x=_{NA} > x_n$" and insert -- $x_{-NA} > x_n$ --.

Signed and Sealed this
Nineteenth Day of July, 2016

Michelle K. Lee
*Director of the United States Patent and Trademark Office*